United States Patent
Yamano

(10) Patent No.: US 7,288,841 B2
(45) Date of Patent: Oct. 30, 2007

(54) LAMINATED SEMICONDUCTOR PACKAGE

(75) Inventor: Takaharu Yamano, Nagano (JP)

(73) Assignee: Shinko Electric Industries, Co., Ltd., Nagano-shi (JP)

( * ) Notice: Subject to any disclaimer, the term of this patent is extended or adjusted under 35 U.S.C. 154(b) by 0 days.

(21) Appl. No.: 11/423,597

(22) Filed: Jun. 12, 2006

(65) Prior Publication Data

US 2006/0278968 A1  Dec. 14, 2006

(30) Foreign Application Priority Data

Jun. 13, 2005 (JP) ............................. 2005-171855

(51) Int. Cl.
*H01L 23/12* (2006.01)
(52) U.S. Cl. .................................. 257/723; 257/777
(58) Field of Classification Search ................ 257/777, 257/723, 778
See application file for complete search history.

(56) References Cited

U.S. PATENT DOCUMENTS

| | | | | |
|---|---|---|---|---|
| 6,316,838 | B1 * | 11/2001 | Ozawa et al. | 257/778 |
| 6,818,999 | B2 * | 11/2004 | Kikuma et al. | 257/777 |
| 6,882,045 | B2 * | 4/2005 | Massingill et al. | 257/724 |
| 6,972,481 | B2 * | 12/2005 | Karnezos | 257/686 |
| 2001/0048151 | A1 | 12/2001 | Chun | |
| 2004/0000707 | A1 | 1/2004 | Roper et al. | |
| 2004/0110323 | A1 | 6/2004 | Becker et al. | |
| 2004/0134681 | A1 | 7/2004 | Tsukahara et al. | |
| 2004/0178499 | A1 | 9/2004 | Mistry et al. | |
| 2004/0262728 | A1 | 12/2004 | Sterrett et al. | |
| 2005/0062173 | A1 | 3/2005 | Vu et al. | |
| 2006/0237225 | A1 | 10/2006 | Kariya et al. | |

FOREIGN PATENT DOCUMENTS

| | | |
|---|---|---|
| JP | 2001-036000 | 2/2001 |
| JP | 2004-265955 | 9/2004 |
| JP | 2005-072596 | 3/2005 |

* cited by examiner

*Primary Examiner*—Roy Potter
(74) *Attorney, Agent, or Firm*—Rankin, Hill, Porter & Clark LLP

(57) ABSTRACT

A laminated semiconductor package includes: a first package having: an insulating layer; a first semiconductor chip embedded in the insulating layer; a wiring connected to the first semiconductor chip; a first connecting section which is formed on a first face side of the insulating layer and connected to the wiring; and a second connecting section which is formed on a second face side of the insulating layer and connected to the wiring, the second face side being opposite to the first face side; and a second package having: a second semiconductor chip; and a third connecting section connected to the second semiconductor chip. In the laminated semiconductor chip, the first package and the second package are laminated one on the other, and the second connecting section and the third connecting section are connected to each other.

9 Claims, 4 Drawing Sheets

LAMINATED SEMICONDUCTOR PACKAGE

This application claims foreign priority based on Japanese Patent application No. 2005-171855, filed Jun. 13, 2005, the content of which is incorporated herein by reference in its entirety.

BACKGROUND OF THE INVENTION

1. Field of the Invention

The present invention relates to a semiconductor package, and in particular to a laminated semiconductor package in which semiconductor chip packages are laminated.

2. Description of the Related Art

In recent years, there have been proposed a variety of SiPs (System-in Packages) where a plurality of semiconductor chips is mounted on a single package in order to provide a predetermined system by the single package.

For example, FIG. 1 schematically shows a structure of a 3-chip-stack F-BGA (ball grid array) as one of the forms of SiP.

Referring to FIG. 1, a package 100 shown in FIG. 1 has a structure where an interposer 101 made of organic material, for example, with semiconductor chips 102, 103, 105 laminated thereon is sealed with a mold resin 107. Between the semiconductor chips 103 and 105 is inserted a spacer 104.

The semiconductor chip 102 mounted on the interposer 101 is for example a semiconductor chip including a logic device. The semiconductor chip 103 is configured with a semiconductor chip including a DRAM (dynamic random-access memory), and the semiconductor chip 105 is configured with a semiconductor chip including a flash memory. In other words, a semiconductor chip including the memory device is laminated on a semiconductor chip including the logic device. (For example, refer to JP-A-2001-36000 and JP-A-2005-72596.)

A semiconductor chip including a logic device generally has a problem of a large heating value. Especially in terms of the above package, the semiconductor chips in the upper layer (semiconductor chips 103, 105) are subjected to the influence of thermal radiation from the semiconductor chip in the lower layer (semiconductor chip 102). This degrades the reliability of system operation.

A solution to this problem is a laminated package where a package mounting a semiconductor chip including a logic device and a separate package mounting a semiconductor chip including a memory device are laminated one on the other.

FIG. 2 is an exemplary structure of a laminated package. Referring to FIG. 2, a laminated package (also called a package-on-package or PoP) 400 shown in FIG. 2 is for example a laminated package where an F-BGA package 200 is laminated on a package 300 as a flip-chip-type chip mounting substrate.

The package 300 has multilayer wirings on both face sides of a core substrate 301. On one face side of the multilayer wiring is mounted a semiconductor chip. On the other face side is formed a connecting section for connection to a mother board.

In the core substrate 301 is formed a via hole piercing the core substrate 301. A via-plug 308 is formed on the inner surface of the via hole. On the first face side (upper face side) of the core substrate 301 are laminated insulating layers 302, 303. In these insulating layers or on the insulating layers are laminated wiring structures 309, 310, 311 including pattern wirings and via-plugs to form a multilayer wiring structure.

On the wiring structure 311 as a top layer of the multilayer wiring is formed a solder resist layer 304 including an opening. On the wiring structure 311 exposed from the opening of the solder resist layer 304 is provided a bump 318 connected to a semiconductor chip 316. To the wiring structure 311 are connected solder balls 205 of the package 200.

On the second face side opposite to the first face side of the core substrate 301 is formed a same structure as the upper structure. That is, insulating layers 305, 306 are laminated and in these insulating layers or on the insulating layers are laminated wiring structures 312, 313, 314 including pattern wirings and via-plugs to form a multilayer wiring structure.

A solder resist layer 307 including an opening is formed to cover the wiring structure 314 as a bottom layer of the multilayer wiring. Further, to the wiring structure 314 exposed from the opening of the solder resist layer 307 are connected solder balls 315 for connection to a mother board, for example.

The package 200 is configured with, for example, F-BGA. On the interposer 201 are laminated semiconductor chips 202, 203 and the semiconductor chips 202, 203 are sealed with a mold resin 204. Under the interposer 201 are formed solder balls 205 electrically connected to the mounted semiconductor chips.

In the laminated package 400, for example the semiconductor chip 316 is a semiconductor chip including a logic device. The semiconductor chips 202, 203 are a semiconductor chips including memory devices.

This reduces the influence of heading of a semiconductor chip including a logic device on a semiconductor chip including a memory device, thus improving the system stability compared with a related art SiP.

One of the problems with the laminated package 400 is that it is difficult to support a larger number of pins in a semiconductor chip mounted on the package 200. In the laminated package 400, the semiconductor chip is mounted in a flip-chip structure on the package 300, as well as the package 200 being laminated on the package 300. This makes it difficult to form a connecting section for connecting the upper and lower packages, on a surface area where the semiconductor chip is mounted.

In recent years, even a memory semiconductor chip has accommodated more and more pins so that the structure of the package 400 could not support the semiconductor chip having multiple pins. It is also difficult for this type of laminated package to mount a semiconductor chip having multiple pins and including a logic device, on the upper layer.

SUMMARY OF THE INVENTION

The present invention has been made in view of the above circumstances, and provides a new and useful laminated semiconductor package that solves the above problems.

The present invention provides a laminated semiconductor package including a plurality of semiconductor chips, that suppresses reduction in the reliability of operation caused by the influence of thermal radiation from a semiconductor chip, and supports a semiconductor chip having multiple pins.

In some implementations, a laminated semiconductor package of the invention comprises:

a first package including:
an insulating layer;
a first semiconductor chip embedded in the insulating layer;
a wiring connected to the first semiconductor chip;
a first connecting section which is formed on a first face side of the insulating layer and connected to the wiring; and
a second connecting section which is formed on a second face side of the insulating layer and connected to the wiring, the second face side being opposite to the first face side; and
a second package including:
a second semiconductor chip; and
a third connecting section connected to the second semiconductor chip,
wherein the first package and the second package are laminated one on the other, and
the second connecting section and the third connecting section are connected to each other.

According to the invention, semiconductor chips are separately laminated by way of separate packages. This suppresses reduction in the reliability of operation caused by the influence of thermal radiation from a semiconductor chip and supports a semiconductor chip having multiple pins.

In the laminated semiconductor package of the invention, the second package further includes a third semiconductor chip being laminated on the second semiconductor chip. This structure is preferable since it is possible to mount a plurality of semiconductor chips on the first package.

In the laminated semiconductor package of the invention, the third connecting section is arranged in a grid array. This structure is preferable because it supports a semiconductor chip having multiple pins.

The second package may be a ball grid array or a pin grid array.

In the laminated semiconductor package of the invention, the first semiconductor chip includes a logic device, and the second semiconductor chip includes a memory device.

This structure is preferable because it is possible to thermally separate a semiconductor chip including a logic device generating a large heating value.

In the laminated semiconductor package of the invention, the second connecting section is formed at least above the first semiconductor chip. This structure provides a wider area where the connecting sections of the first and second packages are formed thereby supporting a semiconductor chip having multiple pins.

According to the invention, it is possible to provide a laminated semiconductor package including a plurality of semiconductor chips, that suppresses reduction in the reliability of operation caused by the influence of thermal radiation from a semiconductor chip and supports a semiconductor chip having multiple pins.

DESCRIPTION OF THE PREFERRED EMBODIMENTS

An embodiment of the invention will be described.

First Embodiment

Figure 1:
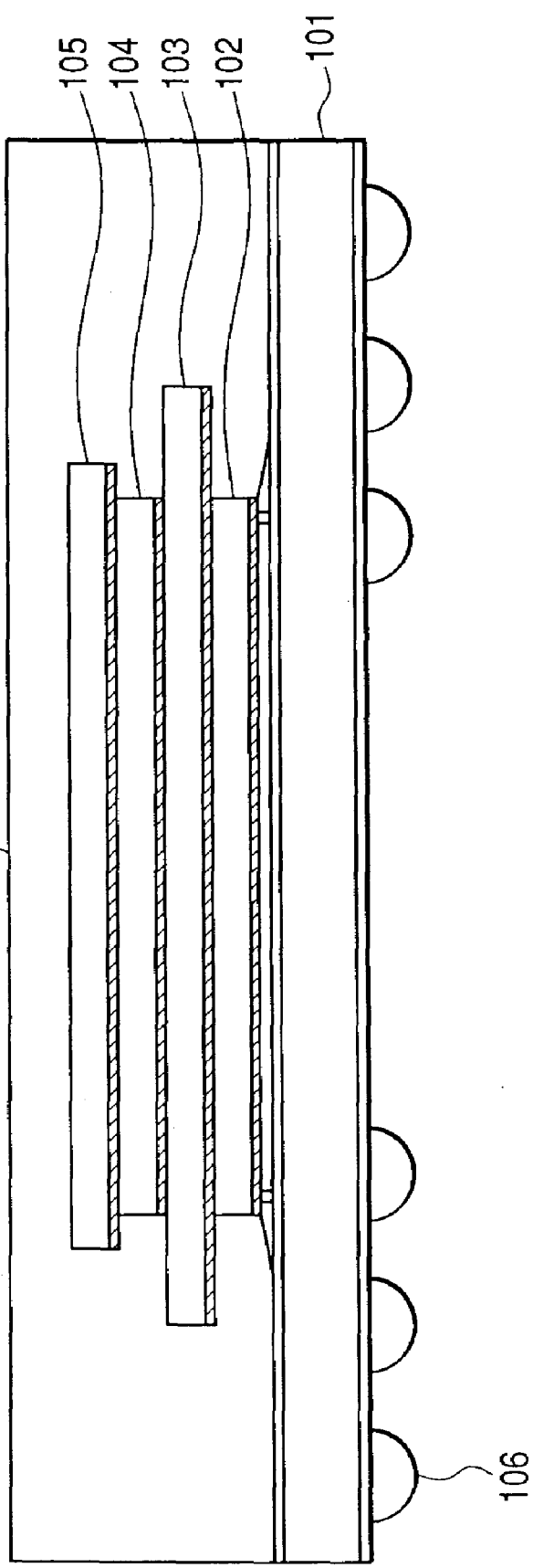
FIG. 1 shows an example of a related art semiconductor package.
Figure 2:
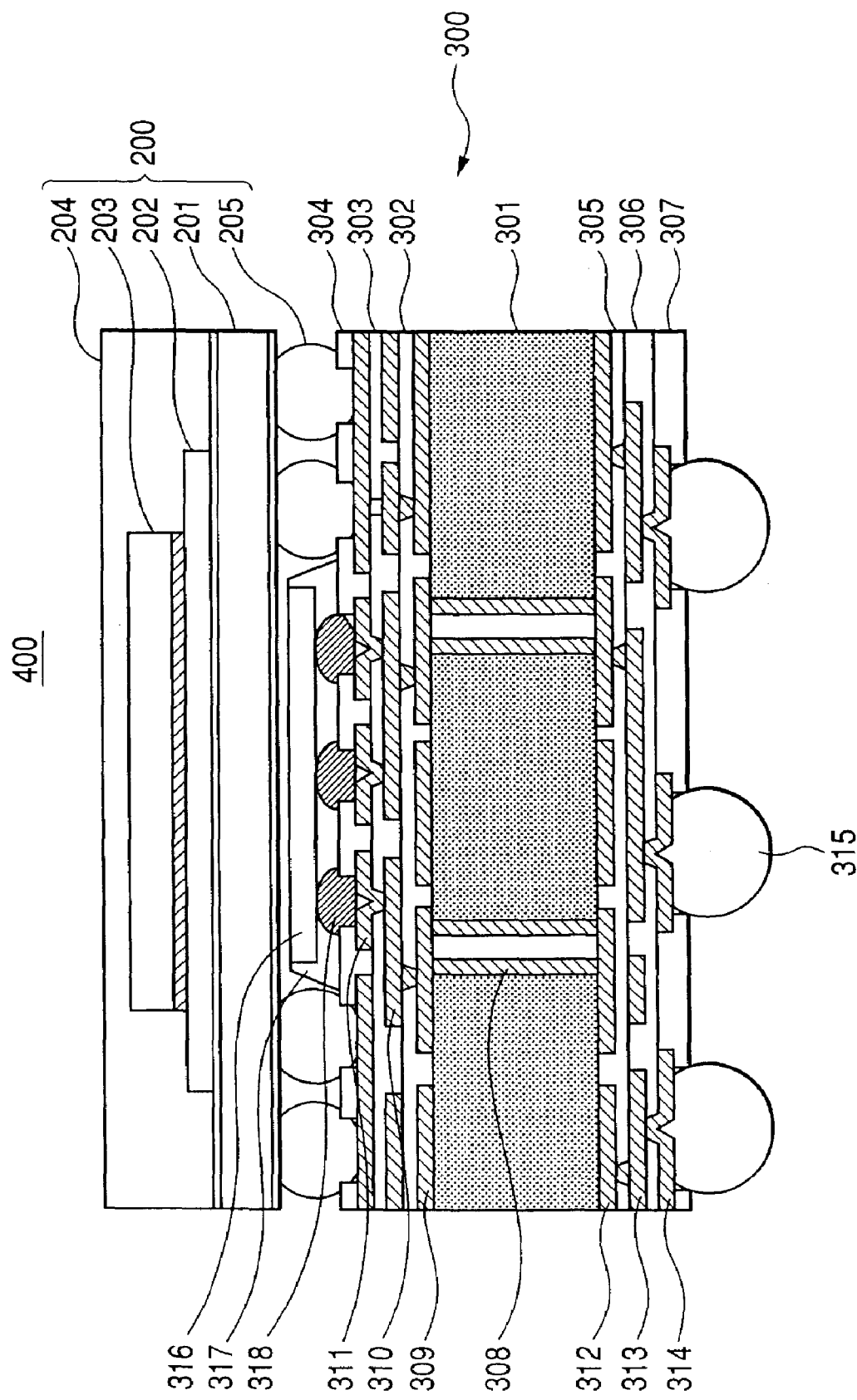
FIG. 2 shows an example of a laminated semiconductor package.
Figure 3:
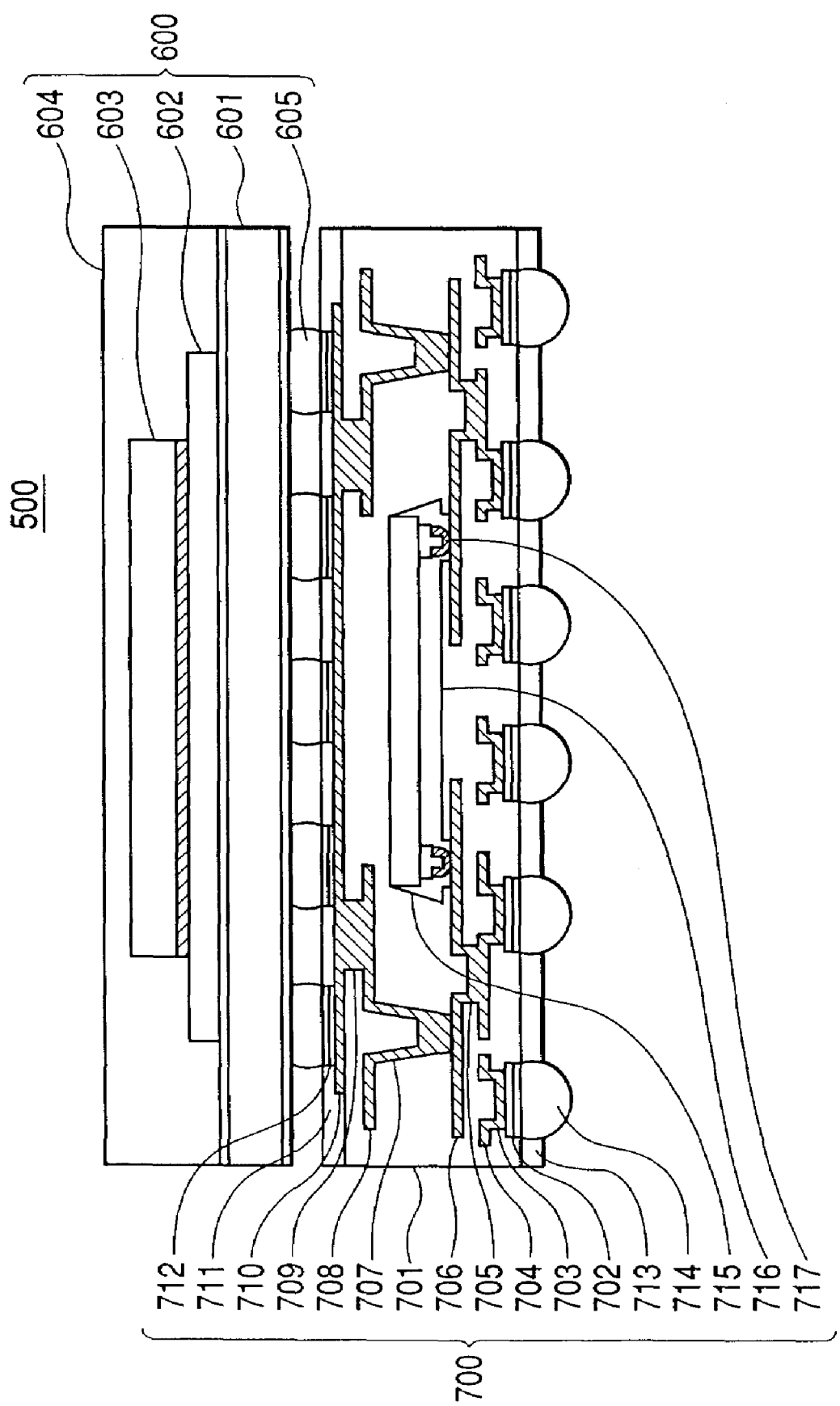
FIG. 3 shows a laminated semiconductor package according to a first embodiment.

FIG. 3 schematically shows a laminated semiconductor package 500 according to a first embodiment of the invention.

Referring to FIG. 3, the laminated semiconductor package 500 has an exemplary structure where a package 600 configured with an F-BGA is laminated on a package 700 configured with a substrate incorporating a semiconductor chip.

The package 700 has a structure where an insulating layer 701 made of a resin material such as epoxy with a semiconductor chip 715 embedded therein. Further, the insulating layer 701 has a wiring structure including via-plugs 703, 705, 707, 709 and pattern wirings 704, 706, 708, 710.

Among the pattern wirings, a solder resist layer 711 having an opening is formed on the pattern wiring 710 as the top layer (the face side where the package 600 is laminated). A connection layer 712 for connection to the package 600 is formed on the pattern wiring 710 exposed from the opening. The connection layer 712 is for example an Au/Ni layer.

Among the via-plugs, on the bottom surface of the via-plug 703 in the bottom layer (opposite to the face side where the package 600 is laminated) is formed a connection layer 702 for connection to a connection target such as a mother board. The connection layer 702 is for example a Ni/Au layer. A solder resist layer 713 having an opening so as to allow the connection layer 702 to be exposed is formed to cover the insulating layer 701 on the circumference of the connection layer 702. On the connection layer 702 are formed solder balls 714 as required in order to allow easy electrical connection to the connection target.

The insulating layer 701 and the wiring structure embedded in the insulating layer 701 may be formed for example via the buildup method as a general method. To form the wiring structure, a via hole is formed in the insulating layer at first, and the via-plug 703 and the pattern wiring 704 are respectively formed on the inner surface of the via hole and on the insulating layer by using Cu plating. Next, an insulating layer is formed newly on the pattern wiring 704. Similarly, the via-plug 705 and the pattern wiring 706 are formed. In the same way, insulating layers are laminated and the via-plug 707 and the pattern wiring 708 as well as the via-plug 709 and the pattern wiring 710 are sequentially formed. The laminated insulating layers integrally form the insulating layer 701.

The semiconductor chip 715 is provided on the pattern wiring 706 after the pattern wiring 706 is formed. In this case, reliability of electrical connection between the semiconductor chip 715 and the pattern wiring 706 is upgraded by a connecting section 717. The connecting section 717 includes an Au stud bump formed on the side of the semiconductor chip and a soldering layer formed on side of the pattern wiring. An underfill layer 716 may be formed below the semiconductor chip 715.

The package 600 laminated on the package 700 has a structure where a semiconductor chip 602 is arranged on an interposer made of for example an organic material, the structure being sealed with a mold resin 604. As shown in FIG. 3, a structure (MCP: multi-chip package) may be taken where a semiconductor chip 603 is further laminated on the semiconductor chip 602. In this case, more than two layers of semiconductor chips may be laminated, thus allowing high-density packaging of semiconductor chips.

On the bottom surface (facing the package 700) of the interposer 601 are formed solder balls 605 as a connecting section for connecting a semiconductor chip mounted on the interposer 601 and the package 700. The solder balls 605 are formed in a grid array to support a semiconductor chip having multiple pins to be mounted. For example, the package 600 is typically configured with a BGA but is not limited thereto and may be a PGA (pin grid array).

In case a semiconductor chip including a logic device and a semiconductor chip including a memory device are laminated, for example, it is preferable to mount the semiconductor chip including a logic device on the package 700 (semiconductor chip 715) and the semiconductor chip including a memory device on the package 600 (semiconductor chips 602, 603). In this case, it is possible to separate a semiconductor chip including a logic device generating a large heating value and suppress the influence of heat to the upper-layer semiconductor chip, thus improving the reliability of operation. For example, a semiconductor chip mounted on the package 600 may be a semiconductor chip such as a DRAM and a flash memory.

By mounting a semiconductor chip including a logic device on the lower-layer package (package 700), support for KGD (known good die) is made easy.

In the laminated semiconductor chip package according to this embodiment, the lower-layer package has a built-in semiconductor chip. Thus, in case a connecting section between the upper-layer and lower-layer packages is formed, the area where the connecting section is formed is made larger compared with the related art PoP structure. For example, in the package according to this embodiment, it is possible to form above the semiconductor chip 715 a connecting section used to connect the upper-layer and lower-layer packages.

This enhances the flexibility of package design and supports a device having an increased number of connection pins, or a device having multiple pins, in particular a device having multiple pins which is mounted on the upper layer side. The above structure is effective for a case where a device having multiple pins is mounted on the upper layer side as well as a case where a plurality of semiconductor chips is mounted on the upper layer side.

As described above, the lower-layer package has a built-in semiconductor chip. The semiconductor chip 715 is embedded in the insulating layer 701. Preferably, the insulating layer includes at least one reinforcing layer so as to reinforce the insulating layer. The reinforcing layers may be respectively formed on a front face side of the insulating layer and a rear face side of the insulating layer.

Accordingly, the lower-layer package can be obtained that is less in warpage of the substrate incorporating the semiconductor chip, high in its flatness, and the lower-layer package can meet a finely configured wiring. Further, the reinforcing layers can be met by a partial replacement of the layer of a usual build-up layer (the insulating layer), so that a usual build-up method can be applied to the reinforcing layers. Therefore, the substrate is easily formed with high reliability and the small thickness can be realized.

The above laminated semiconductor package 500 may be formed by the method described below.

Figure 4:
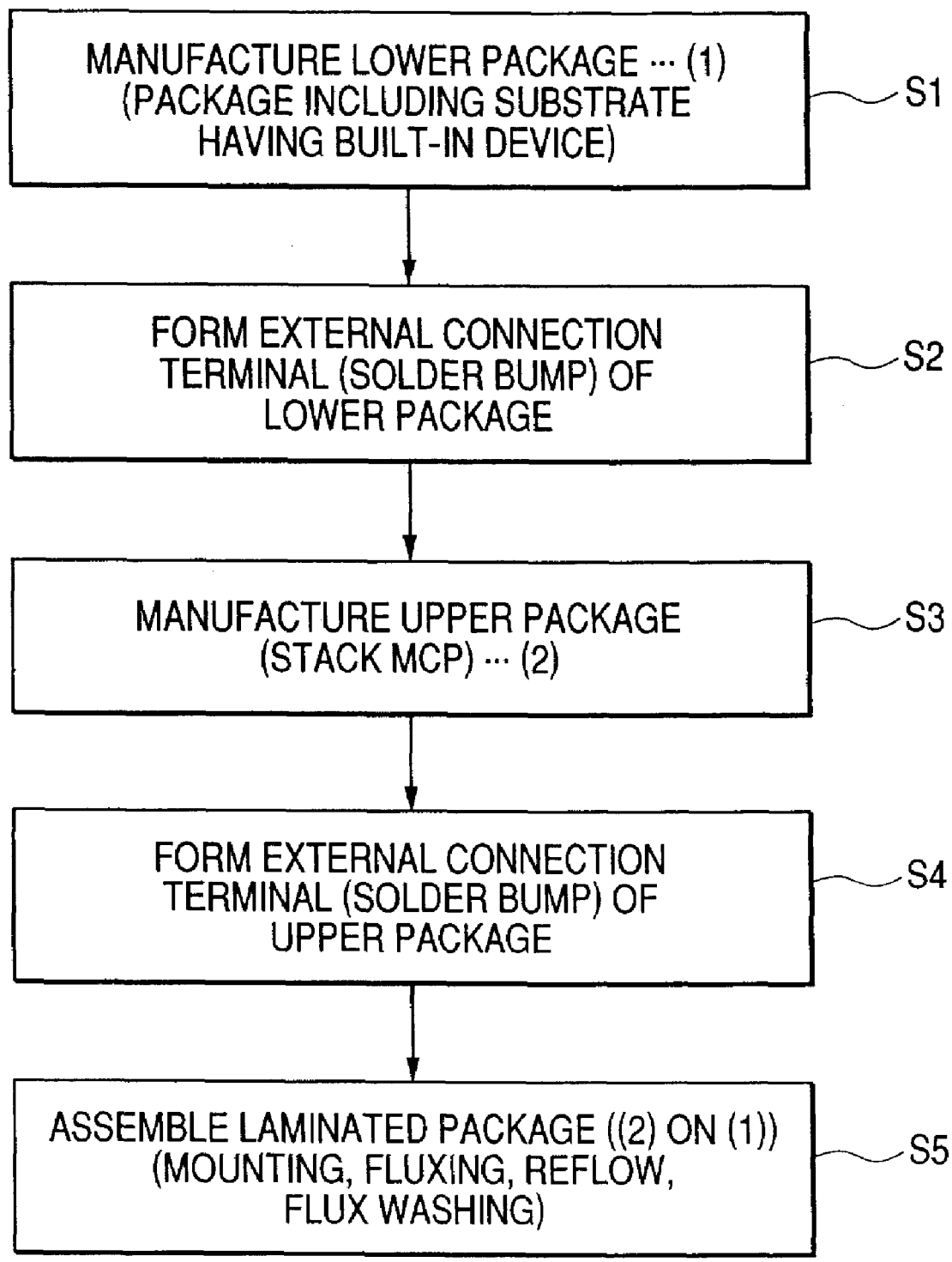
FIG. 4 shows a method for manufacturing the laminated semiconductor package shown in FIG. 1.

FIG. 4 is a flowchart showing a method for manufacturing the laminated semiconductor package 500 according to the first embodiment. Referring to FIG. 4, in step 1 (represented as S1, and similarly represented so on in FIG. 4), the package 700 as a lower-layer package is manufactured for example by way of the buildup method. In step 2, the solder balls 714 are formed as required.

Next, in step 3, the package 600 as an upper-layer package is formed by way of a related art method. In this case, the semiconductor chips 602, 603 are mounted on the interposer 601 and electrical connection is established with the interposer for example by way of wire bonding (not shown in FIG. 3). In step 4, the solder balls 605 are formed.

In step 5, the package 600 is laminated on the package 700, and processes of mounting, fluxing, reflow and flux washing are sequentially executed so as to form the laminated semiconductor package 500 shown in FIG. 3.

The order of manufacturing the packages 600 and 700 may be switched.

The materials and wiring structures described above are an example of the invention and may be modified or changed an various ways within the scope of the invention.

For example, the number or type of semiconductor chips mounted on a package may be changed in various ways. The number of layers in a multilayer wiring structure may be arbitrarily changed.

According to the invention, it is possible to provide a laminated semiconductor package including a plurality of semiconductor chips that suppresses reduction in the reliability of operation caused by the influence of thermal radiation from a semiconductor chip, and supports a semiconductor chip having multiple pins.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A laminated semiconductor package comprising:
   a first package including:
      an insulating layer having a first face side and a second face side opposite to the first face side;
      a first semiconductor chip embedded in the insulating layer between the first face side and the second face side;
      a wiring connected to the first semiconductor chip;
      a first connecting section formed on the first face side of the insulating layer and connected to the wiring; and
      a second connecting section formed on the second face side of the insulating layer and connected to the wiring; and
   a second package including:
      a second semiconductor chip; and
      a third connecting section connected to the second semiconductor chip,
   wherein the first package and the second package are laminated one on the other, and
   the second connecting section and the third connecting section are connected to each other.

2. The laminated semiconductor package according to claim 1, wherein the second package further includes a third semiconductor chip being laminated on the second semiconductor chip.

3. The laminated semiconductor package according to claim 1, wherein the third connecting section is arranged in a grid array.

4. The laminated semiconductor package according to claim 3, wherein the second package is a ball grid array or a pin grid array.

5. The laminated semiconductor package according to claim 1, wherein the first semiconductor chip includes a logic device, and
the second semiconductor chip includes a memory device.

6. The laminated semiconductor package according to claim 1, wherein the second connecting section is formed at least above the first semiconductor chip.

7. The laminated semiconductor package according to claim 1, wherein the first package includes at least one reinforcing layer for reinforcing the insulating layer.

8. The laminated semiconductor package according to claim 7, wherein said at least one reinforcing layer includes a plurality of reinforcing layers, and
the reinforcing layers are respectively formed on the first face side of the insulating layer and the second face side of the insulating layer.

9. The laminated semiconductor package according to claim 1, wherein the wiring connected to the first semiconductor chip, the first connecting section and the second connecting section is embedded in the insulating layer between the first face side and the second face side.

* * * * *